(12) United States Patent
Hummler

(10) Patent No.: US 7,272,070 B2
(45) Date of Patent: Sep. 18, 2007

(54) MEMORY ACCESS USING MULTIPLE ACTIVATED MEMORY CELL ROWS

(75) Inventor: Klaus Hummler, Apex, NC (US)

(73) Assignee: Infineon Technologies AG, Munich (DE)

( * ) Notice: Subject to any disclaimer, the term of this patent is extended or adjusted under 35 U.S.C. 154(b) by 83 days.

(21) Appl. No.: 11/018,313

(22) Filed: Dec. 21, 2004

(65) Prior Publication Data
US 2006/0133186 A1 Jun. 22, 2006

(51) Int. Cl.
*G11C 7/10* (2006.01)

(52) U.S. Cl. .............................. 365/238.5; 365/230.03; 710/35

(58) Field of Classification Search ............. 365/238.5, 365/230.03; 710/35
See application file for complete search history.

(56) References Cited

U.S. PATENT DOCUMENTS

| | | | |
|---|---|---|---|
| 4,477,884 A | 10/1984 | Iwahashi et al. | |
| 5,757,715 A * | 5/1998 | Williams et al. | 365/230.03 |
| 5,784,331 A * | 7/1998 | Lysinger | 365/230.06 |
| 5,822,268 A | 10/1998 | Kirihata | |
| 5,875,452 A * | 2/1999 | Katayama et al. | 711/105 |
| 6,031,785 A * | 2/2000 | Park et al. | 365/230.08 |
| 6,081,479 A | 6/2000 | Ji et al. | |
| 6,253,297 B1 * | 6/2001 | Chauvel et al. | 711/167 |
| 6,510,097 B2 * | 1/2003 | Fukuyama | 365/230.03 |
| 6,557,090 B2 * | 4/2003 | Ho | 711/163 |
| 6,636,453 B2 | 10/2003 | Fischer et al. | |
| 6,643,211 B2 | 11/2003 | Feurle | |
| 6,700,831 B2 | 3/2004 | Feurle | |
| 6,711,072 B2 | 3/2004 | Fischer et al. | |
| 6,711,085 B2 | 3/2004 | Fischer et al. | |
| 6,728,143 B2 | 4/2004 | Feurle | |
| 2002/0040429 A1 * | 4/2002 | Dowling | 712/228 |
| 2005/0057996 A1 * | 3/2005 | Yamauchi et al. | 365/222 |

OTHER PUBLICATIONS

PCT International Search Report and Written Opinion dated Apr. 4, 2006.
Sejun Kim et al., A 300MHz Burst-Pipelined CMOS SRAM macro with Folded Bit-line Scheme, Tencon 99. Proceedings of the IEEE Region 10 Conference Cheju Island, South Korea Sep. 15-17, 1999, Piscataway, NJ, USA, IEEE, US, Sep. 1999 vol. 2: pp. 1042-1045.
Toshiaki Kirihata et al., A 390-mm2, 16-Bank, 1-Gb DDR SDRAM with Hybrid Bitline Architecture, IEEE Journal of Solid-State Circuits, Nov. 1999 vol. 34(11): pp. 1580-1588.

* cited by examiner

*Primary Examiner*—Richard T. Elms
*Assistant Examiner*—Eric Wendler
(74) *Attorney, Agent, or Firm*—Patterson & Sheridan, L.L.P.

(57) ABSTRACT

For one or more disclosed embodiments, a plurality of rows of memory cells in a memory bank are activated, and a column of memory cells in the memory bank is selected to select memory cells common to activated rows and the selected column. At least one of the selected memory cells common to activated rows and the selected column is selectively accessed. The selecting and the selectively accessing are repeated to access memory cells common to activated rows and a plurality of selected columns.

20 Claims, 5 Drawing Sheets

MEMORY ACCESS USING MULTIPLE ACTIVATED MEMORY CELL ROWS

BACKGROUND

1. Field of the Invention

The invention generally relates to memory access.

2. Description of the Related Art

FIG. 1 illustrates prior art circuitry 100 for a dynamic random access memory (DRAM) architecture. As illustrated in FIG. 1, a memory bank 120 comprises a plurality of memory arrays, such as a memory array 122 for example, each having a plurality of rows of memory cells.

To access one or more memory cells in memory bank 120 at a desired memory address 101 for a read or write command, a row decoder 112 decodes a row address portion 102 of memory address 101 to select and activate one row 132 of memory cells in memory bank 120 by activating a word line to activate switches to couple memory cells in row 132 to corresponding primary sense amplifiers in a sense amplifier bank 162 for row 132. A column decoder 114 decodes a column address portion 104 of memory address 101 to select one column 142 of memory cells by activating switches to couple primary sense amplifiers corresponding to memory cells in column 142 to corresponding local data line pairs, thereby coupling the primary sense amplifier coupled to a memory cell 150 common to row 132 and column 142 to local data line pair 172.

Each sense amplifier bank in memory bank 120 comprises circuitry responsive to the activation of a row of memory cells corresponding to the sense amplifier bank to generate a row valid signal to activate master data line switches corresponding to the sense amplifier bank. The activated master data line switches couple local data line pairs corresponding to the sense amplifier bank to a master data line pair 180 for access to a memory cell in the activated row and a selected column. Sense amplifier bank 162, for example, comprises circuitry responsive to the activation of row 132 to generate a row valid signal to activate master data line switches 182 and therefore couple local data line pair 172 to master data line pair 180 for access, for example, to memory cell 150 when column 142 is selected. Master data line pair 180 leads to a secondary sense amplifier.

Although activating a new row of memory cells is a relatively slow operation due to the amount of time required for precharging and sensing, selecting a new column in an already activated row is a relatively fast operation. Multiple memory cells in an already activated row may therefore be rapidly accessed successively for a single read or write command to improve data throughput. After memory cell 150, for example, has been accessed, a column address counter 119 may be used to access one or more additional memory cells in row 132 successively while row 132 remains activated. Accessing multiple memory cells for a single read or write command is known as a burst access. The number of memory cells to be accessed in a burst access is known as the burst length. The memory cells available for a burst access are known as a page. The number of memory cells available for a burst access is known as the page length.

A single burst access of memory bank 120 is limited, however, to use of only the memory cells in a single activated row. While the number of memory cells in a row may be increased to increase the page length, doing so incurs increased word line resistance and increased access times. Successively accessing large amounts of data, such as for graphics applications for example, therefore requires multiple burst accesses to access multiple rows in memory bank 120. Successively activating multiple rows for access, however, incurs increased latency costs.

SUMMARY

One or more disclosed methods comprise activating a plurality of rows of memory cells in a memory bank, selecting a column of memory cells in the memory bank to select memory cells common to activated rows and the selected column, selectively accessing at least one of the selected memory cells common to activated rows and the selected column, and repeating the selecting and the selectively accessing to access memory cells common to activated rows and a plurality of selected columns.

One or more disclosed apparatuses comprise a memory bank having a plurality of memory cells, circuitry to activate a plurality of rows of memory cells in the memory bank, circuitry to select a column of memory cells in the memory bank to select memory cells common to activated rows and the selected column, circuitry to access selectively at least one of the selected memory cells common to activated rows and the selected column, and burst control circuitry to control the selection of a column of memory cells and the selective access to at least one of the selected memory cells common to activated rows and a selected column to access memory cells common to activated rows and a plurality of selected columns.

One or more disclosed systems comprise one or more processors; a memory controller; memory comprising one or more memory banks each having a plurality of memory cells; circuitry to activate a plurality of rows of memory cells in each of one or more of the memory banks; circuitry to select a memory bank, to select a column of memory cells in the selected memory bank to select memory cells common to activated rows and the selected column, and to access selectively at least one of the selected memory cells common to activated rows and the selected column; and burst control circuitry to control the selection of a memory bank, the selection of a column of memory cells, and the selective access to at least one of the selected memory cells common to activated rows and a selected column to access memory cells common to activated rows and a plurality of selected columns in each of at least one selected memory bank.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide memory access using multiple activated memory cell rows to help increase data throughput by increasing the number of memory cells available for a burst access.

Figure 2:
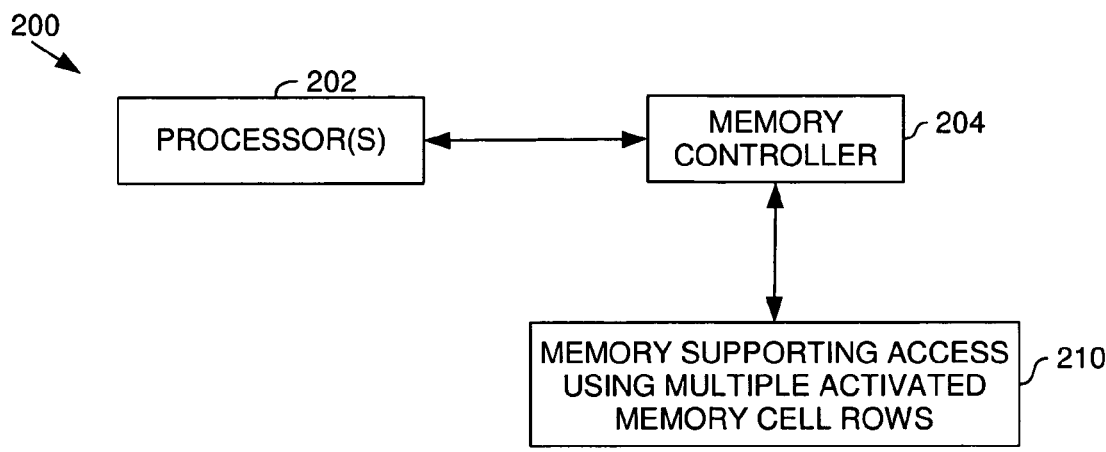
FIG. 2 illustrates, for one or more embodiments, an example system having memory with access using multiple activated memory cell rows.

FIG. 2 illustrates, for one or more embodiments, an example system 200 comprising one or more processors 202, a memory controller 204, and memory 210 supporting access using multiple activated memory cell rows. Memory controller 204 for one or more embodiments may be coupled to processor(s) 202 and to memory 210 to read data from and/or write data to memory 210 for processor(s) 202. Memory 210 for one or more embodiments has a dynamic random access memory (DRAM) architecture.

Figure 1:
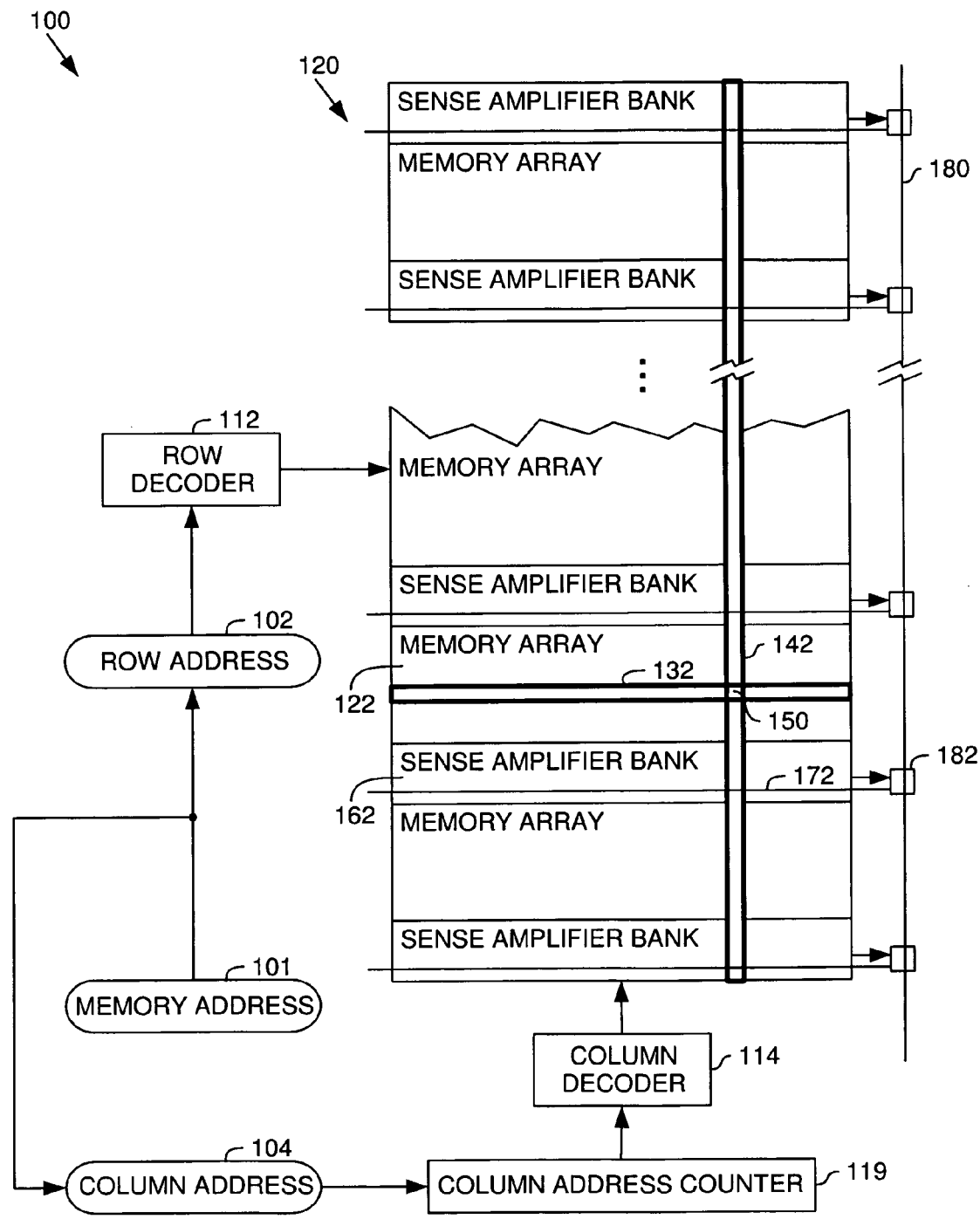
FIG. 1 illustrates prior art circuitry for a dynamic random access memory (DRAM) architecture.

Memory 210 comprises a plurality of rows of memory cells to store data and circuitry to access memory cells in multiple activated rows to read data from and write data to memory 210. Activating multiple memory cell rows for one or more embodiments may help increase data throughput by extending the page length of memory 210 beyond the number of memory cells in one row. As one example where memory 210 may activate 16 rows of memory and each row can store 512 bits of data, memory 210 may have a page length of 8,192 (8 k) bits compared to just 512 bits for prior art circuitry 100 of FIG. 1. Memory 210 for one or more embodiments may then support burst accesses to memory cells across multiple rows and therefore help reduce, minimize, or avoid multiple successive row activations which incur increased latency costs. Memory 210 for one or more embodiments may also support a burst access having a burst length greater than the number of memory cells in one row and therefore help increase the amount of data that may be read from or written to memory 210 for a single read or write command from memory controller 204. Memory 210 for one or more embodiments may therefore support successive access to large amounts of data, such as for graphics applications for example, with reduced latency.

Memory controller 204 for one embodiment may be integrated and/or packaged with one or more of processor(s) 202. Processor(s) 202, memory controller 204, and memory 210 may be used in any suitable system for any suitable purpose, such as for a personal computer system or a graphics processing system or subsystem for example. Although described in connection with interfacing with memory controller 204 in system 200, memory 210 may interface with any suitable device in any suitable system.

Memory Access Using Multiple Row Activation

Figure 3:
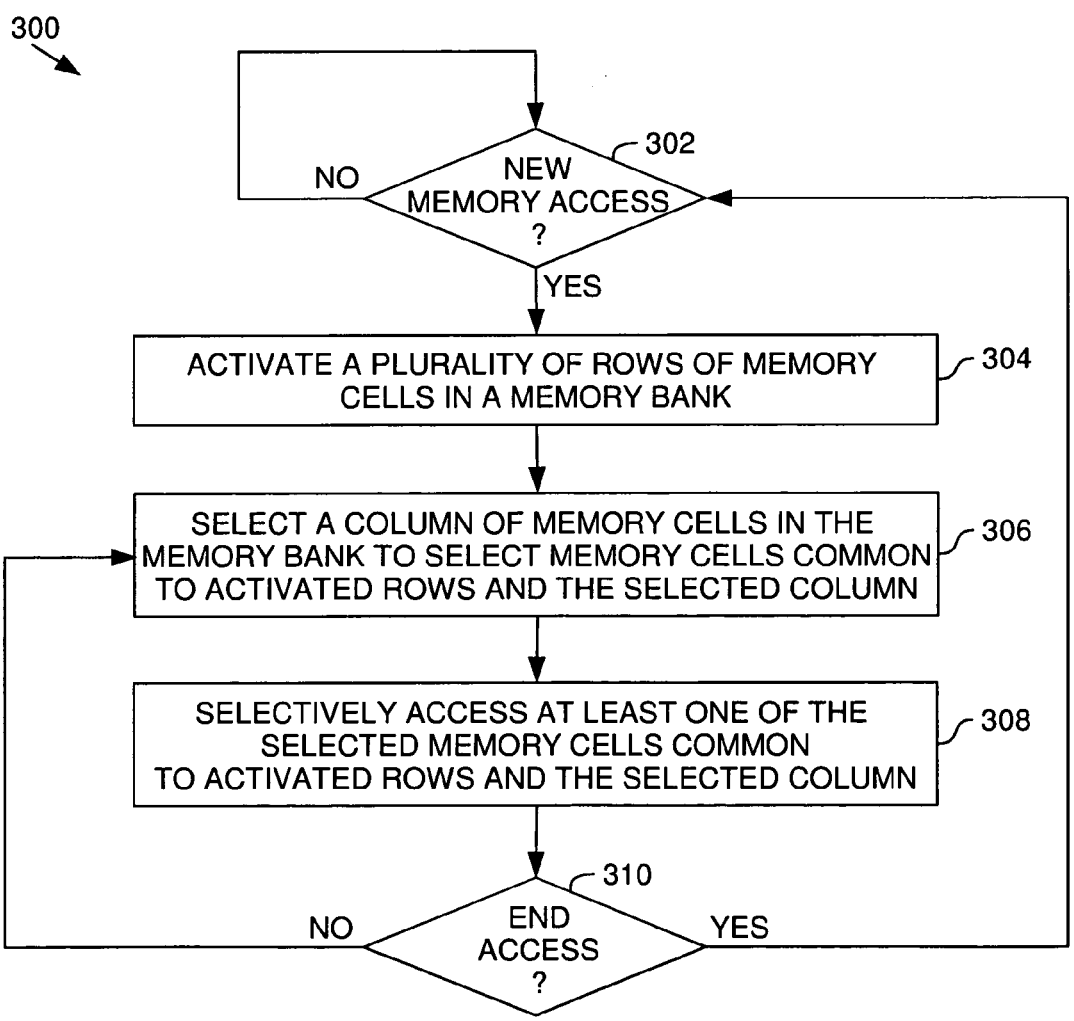
FIG. 3 illustrates, for one or more embodiments, a flow diagram for memory access using multiple activated memory cell rows.

Memory 210 for one or more embodiments may comprise circuitry to access memory cells in multiple activated rows in accordance with a flow diagram 300 of FIG. 3. Memory 210 for one or more embodiments may comprise circuitry 400 which is illustrated in FIG. 4 and which will be described in connection with flow diagram 300 of FIG. 3.

For block 302 of FIG. 3, memory 210 is to initiate a new memory access. Memory 210 for one or more embodiments may receive a read or write command from memory controller 204 to initiate a new memory access. Memory 210 for one or more embodiments may receive an activate command or a precharge command followed by an activate command from memory controller 204 to initiate a new memory access.

Figure 4:
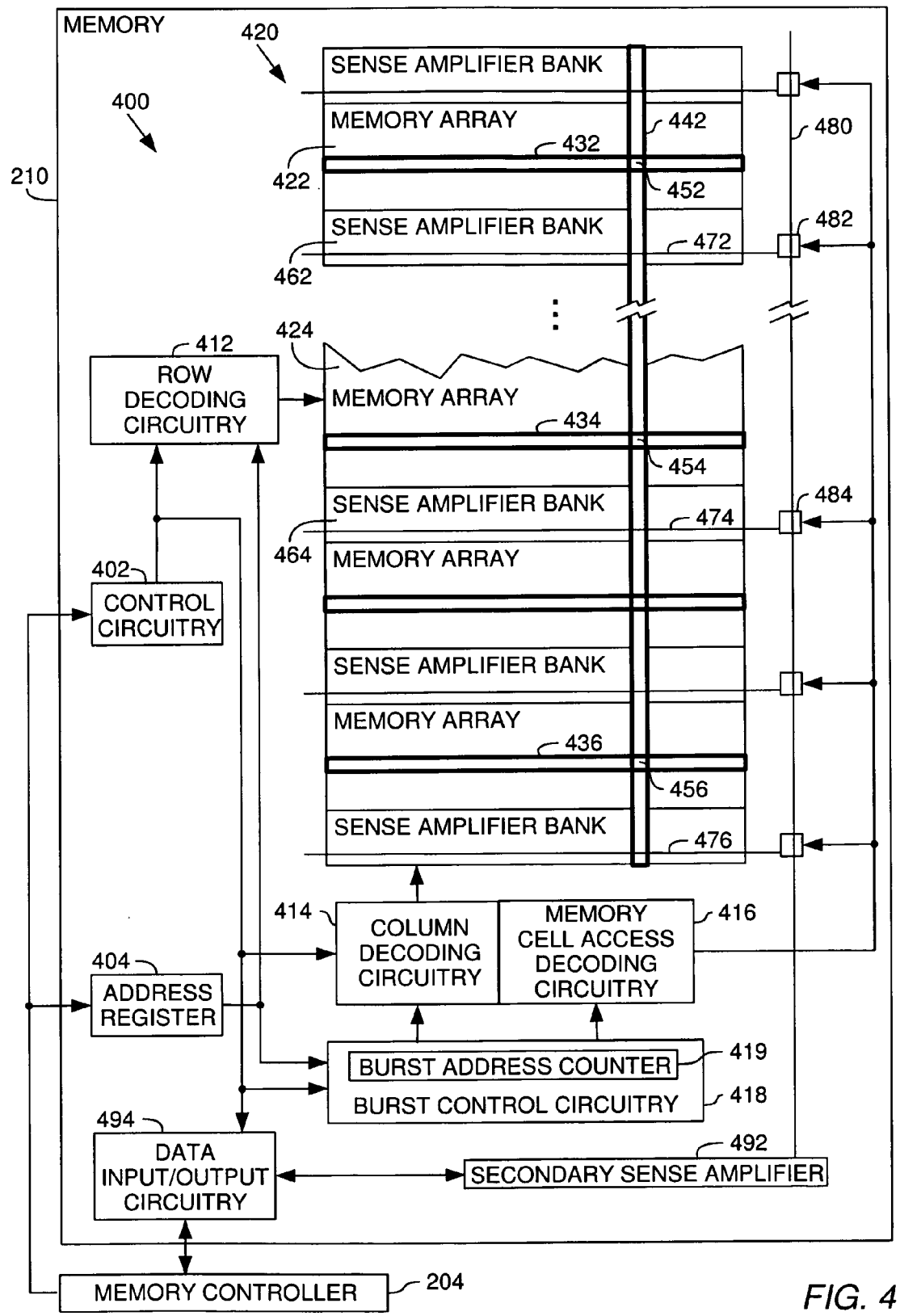
FIG. 4 illustrates, for one or more embodiments, circuitry for memory access using multiple activated memory cell rows.

Memory 210 for one or more embodiments, as illustrated in FIG. 4, may comprise control circuitry 402 to receive one or more commands from memory controller 204 to access memory 210 and one or more address latches and/or registers, such as an address register 404 for example, to receive from memory controller 204 and store a memory address at which memory 210 is to be accessed. Control circuitry 402 may control access to memory 210 at the received memory address in accordance with the received command(s).

Multiple Row Activation

For block 304 of FIG. 3, memory 210 activates a plurality of rows of memory cells in a memory bank. Memory 210 for one or more embodiments may activate a plurality of rows of memory cells in a memory bank substantially simultaneously. Memory 210 for one or more embodiments may select a plurality of rows of memory cells for activation based on an address.

Memory 210 for one or more embodiments, as illustrated in FIG. 4, may comprise a memory bank 420 having a plurality of memory cells. Memory bank 420 may comprise a plurality of memory arrays, such as memory arrays 422 and 424 for example, each having one or more rows of memory cells, such as rows 432 and 434 for example. A memory cell may store one bit of data.

Memory 210 for one or more embodiments may also comprise a plurality of sense amplifier banks, such as sense amplifier banks 462 and 464 for example, coupled to sense data stored in and/or to write data to corresponding rows of memory cells. One or more sense amplifier banks may also comprise corresponding latches to store data read from or to be written to corresponding rows of memory cells. A sense amplifier bank may be shared by multiple rows of memory cells in a single memory array and/or by multiple rows of memory cells in multiple memory arrays. Each sense amplifier bank illustrated as disposed between two memory arrays may be used to access one or more rows of memory cells in the two memory arrays adjacent the sense amplifier bank, and each sense amplifier bank illustrated at an end of memory bank 420 may be used to access one or more rows of memory cells in the memory array adjacent the sense amplifier bank.

Memory 210 for one or more embodiments, as illustrated in FIG. 4, may comprise row decoding circuitry 412 to decode at least a portion of an address to select a plurality of rows of memory cells for activation. Row decoding circuitry 412 may be coupled to control circuitry 402, address register 404, and memory bank 420 and may be controlled by control circuitry 402 to decode at least a portion of the memory address stored in address register 404 to select and activate a plurality of rows of memory cells containing at least one memory cell corresponding to the memory address. Row decoding circuitry 412 may activate a row, such as row 432 for example, by activating a word line corresponding to row 432 to activate switches to couple memory cells in row 432 to corresponding primary sense amplifiers in sense amplifier bank 462.

Row decoding circuitry 412 may activate any suitable number of any suitable rows of memory cells based on an address. Row decoding circuitry 412 may, for example, activate as many rows as possible which may depend, for example, on how the memory arrays and sense amplifier banks are arranged.

Control circuitry 402 for one or more embodiments may identify to row decoding circuitry 412 a page length or a burst length for the memory access initiated for block 302 to help identify the number of rows to be activated for the memory access. Control circuitry 402 for one or more embodiments may receive from memory controller 204 a page length or burst length in a command for a memory access. Control circuitry 402 for one or more embodiments may be programmed by memory controller 204 to set a page length or burst length for one or more memory accesses. Memory controller 204 for one or more embodiments may set a page length and/or a burst length in one or more mode registers of control circuitry 402.

Column Selection

For block 306 of FIG. 3, memory 210 selects a column of memory cells in the memory bank to select memory cells common to activated rows and the selected column. Memory 210 for one or more embodiments may select a column of memory cells based on an address.

Memory 210 for one or more embodiments, as illustrated in FIG. 4, may comprise column decoding circuitry 414 to decode at least a portion of an address to select a column of memory cells in memory bank 420. Column decoding circuitry 414 may be coupled to control circuitry 402, address register 404, and memory bank 420 and may be controlled by control circuitry 402 to decode at least a portion of the memory address stored in address register 404 to select a column of memory cells containing at least one memory cell corresponding to the memory address. Column decoding circuitry 414 may be coupled to receive at least a portion of the memory address stored in address register 404 through burst control circuitry 418 in the form of at least a portion of an initial burst address.

Column decoding circuitry 414 may select a column, such as column 442 for example, by activating switches to couple primary sense amplifiers corresponding to memory cells in column 442 to corresponding local data line pairs. Because memory cells of activated rows are coupled to corresponding primary sense amplifiers, selecting a column effectively selects memory cells common to activated rows and the selected column. As one example, selecting column 442 effectively selects memory cells 452, 454, and 456 of activated rows 432, 434, and 436, respectively, by coupling memory cells 452, 454, and 456 to local data line pairs 472, 474, and 476, respectively.

Selective Memory Cell Access

For block 308 of FIG. 3, memory 210 selectively accesses at least one of the selected memory cells common to activated rows and the selected column. Memory 210 for one or more embodiments may select at least one of the selected memory cells based on an address. Memory 210 for one or more embodiments may select one of the selected memory cells in one activated row for a read access based on an address. Memory 210 for one or more embodiments may select one or more selected memory cells in one or more activated rows for a write access based on an address.

Memory 210 for one or more embodiments, as illustrated in FIG. 4, may comprise memory cell access decoding circuitry 416 to decode at least a portion of an address to select at least one of the selected memory cells. Memory cell access decoding circuitry 416 may be coupled to control circuitry 402, address register 404, and memory bank 420 and may be controlled by control circuitry 402 to decode at least a portion of the memory address stored in address register 404 to select at least one of the selected memory cells corresponding to the memory address. Memory cell access decoding circuitry 416 may be coupled to receive at least a portion of the memory address stored in address register 404 through burst control circuitry 418 in the form of at least a portion of an initial burst address.

Memory cell access decoding circuitry 416 may be coupled to select at least one of the selected memory cells by activating corresponding master data line switches to couple one or more corresponding local data line pairs to a master data line pair 480 for access to such selected memory cell(s). As one example, memory cell access decoding circuitry 416 may select memory cell 452 for read or write access by activating corresponding master data line switches 482 to couple corresponding local data line pair 472 to master data line pair 480.

A secondary sense amplifier 492 may be coupled to sense data on master data line pair 480 for a read access and/or to transmit data onto master data line pair 480 for a write access. Data input/output (I/O) circuitry 494 may be coupled to secondary sense amplifier 492 to output data from memory bank 420 to memory controller 204 for a read access and/or to receive data from memory controller 204 for a write access to memory bank 420.

If memory 210 for block 310 of FIG. 3 is to continue accessing memory cells for the memory access initiated for block 302, memory 210 repeats operations for blocks 306 and 308 to access one or more additional memory cells in one or more activated rows. Memory 210 may repeat operations for blocks 306 and 308 to access any suitable number of any suitable one or more memory cells in any suitable one or more activated rows in any suitable order.

Memory 210 for one or more embodiments may repeat operations for blocks 306 and 308 to access memory cells across multiple activated rows. As one example, memory 210 may repeat operations for blocks 306 and 308 one or more times to access one or more memory cells in one activated row and then repeat operations for blocks 306 and 308 one or more times to access one or more memory cells in another activated row.

Memory 210 for one or more embodiments may repeat operations for blocks 306 and 308 to access memory cells across multiple columns. As one example, memory 210 may repeat operations for blocks 306 and 308 one or more times to access one or more memory cells in one selected column and then repeat operations for blocks 306 and 308 one or more times to access one or more memory cells in another selected column.

Memory 210 for one or more embodiments, as illustrated in FIG. 4, may comprise burst control circuitry 418 to control the selection of a column of memory cells and the selective access to at least one of the selected memory cells common to activated rows and a selected column in repeating operations for blocks 306 and 308. Burst control circuitry 418 for one or more embodiments may be coupled to control circuitry 402, address register 404, column decoding circuitry 414, and memory cell access decoding circuitry 416 and may be controlled by control circuitry 402 to maintain a burst address and to output at least a portion of the burst address to column decoding circuitry 414 and memory cell access decoding circuitry 416 to select a column of memory cells for block 306 and at least one of the selected memory cells for block 308.

Burst control circuitry 418 may receive at least a portion of the memory address stored in address register 404 as an initial burst address and then modify the burst address to repeat operations for blocks 306 and 308. Burst control circuitry 418 may modify and output the burst address to control column decoding circuitry 414 to select another column of memory cells and/or to control memory cell access decoding circuitry 416 to activate other master data line switches corresponding to one or more other activated rows. Burst control circuitry 418 for one or more embodiments may comprise a burst address counter 419 to modify and maintain the burst address.

Burst control circuitry 418 may modify the burst address in any suitable manner to access memory cells of one or more activated rows in any suitable order in repeating operations for blocks 306 and 308. Burst control circuitry 418 for one or more embodiments may modify the burst address to access memory cells in accordance with any suitable sequential pattern.

Burst control circuitry 418 for one or more embodiments may modify the burst address to access memory cells in a generally sequential order along one or more rows of memory cells. To access memory cells along an activated row, burst control circuitry 418 may modify the burst address to have column decoding circuitry 414 select a next column while memory cell access decoding circuitry 416 continues to activate the same master data line switches corresponding to the current row. To access memory cells in a different activated row, burst control circuitry 418 may modify the burst address to have memory cell access decoding circuitry 416 activate master data line switches corresponding to the new row.

Burst control circuitry 418 for one or more embodiments may modify the burst address to access memory cells in a generally sequential order along one or more columns of memory cells. To access memory cells along a column, burst control circuitry 418 may modify the burst address to have memory cell access decoding circuitry 416 select a next memory cell for access while column decoding circuitry 414 continues to select the same column. To access memory cells in a different column, burst control circuitry 418 may modify the burst address to have column decoding circuitry 414 select the new column.

Burst control circuitry 418 for one or more embodiments may modify the burst address to access memory cells in accordance with any suitable interleave pattern.

Control circuitry 402 for one or more embodiments may identify to burst control circuitry 418 a burst type, such as sequential or interleaved for example, for the memory access initiated for block 302 to identify the order in which memory cells are to be accessed in repeating operations for blocks 306 and 308. Control circuitry 402 for one or more embodiments may receive from memory controller 204 a burst type in a command for a memory access. Control circuitry 402 for one or more embodiments may be programmed by memory controller 204 to set a burst type for one or more memory accesses. Memory controller 204 for one or more embodiments may set a burst type in one or more mode registers of control circuitry 402.

Memory 210 repeats operations for blocks 306 and 308 until memory 210 for block 310 of FIG. 3 is to end accessing memory cells for the memory access initiated for block 302. Memory 210 for one or more embodiments may end accessing memory cells for the memory access initiated for block 302 after having accessed a predetermined number of memory cells for the memory access. Memory 210 for one or more embodiments may end accessing memory cells for the memory access initiated for block 302 in response to a burst terminate command from memory controller 204.

Control circuitry 402 for one or more embodiments may control burst control circuitry 418 to end accessing memory cells for the memory access initiated for block 302. Control circuitry 402 for one or more embodiments may receive from memory controller 204 a burst length in a command for a memory access. Control circuitry 402 for one or more embodiments may be programmed by memory controller 204 to set a burst length for one or more memory accesses. Memory controller 204 for one or more embodiments may set a burst length in one or more mode registers of control circuitry 402.

Multiple Memory Cell Access

Memory cell access decoding circuitry 416 for one or more embodiments may select two or more memory cells to be accessed substantially simultaneously to write the same data to such memory cells. Writing data to memory cells in this manner may help increase data throughput, for example, for testing purposes where data topologies may accommodate writing the same data to multiple memory cells substantially simultaneously.

As one example, memory cell access decoding circuitry 416 for block 308 may select memory cells 452 and 454 for write access by activating corresponding master data line switches 482 and 484 to couple corresponding local data line pairs 472 and 474 to master data line pair 480.

As another example, row decoding circuitry 412 for block 304 may activate two or more rows that share the same sense amplifier bank, and memory cell access decoding circuitry 416 for block 308 may select memory cells common to such activated rows and a selected column for write access by activating corresponding master data line switches to couple the local data line pair for the shared sense amplifier bank to master data line pair 480.

Alternative Memory Architectures

Memory 210 for one or more embodiments may access memory cells in multiple activated rows in accordance with flow diagram 300 of FIG. 3 using any other suitable memory architecture.

Memory bank 420 for one or more embodiments may alternatively support any suitable twin-cell memory architecture. In this manner, memory 210 may access for block 308 a pair of memory cells storing complementary bits that may be sensed and/or written by a single sense amplifier. Memory bank 420 for one or more embodiments may comprise circuitry to support single local data lines rather than pairs of local data lines to carry a single bit of data. Memory bank 420 for one or more embodiments may comprise circuitry to support a single master data line rather than a pair of master data lines to carry a single bit of data. Memory 210 for one or more embodiments may therefore not comprise secondary sense amplifier 492.

Although described in connection with memory bank 420 providing one bit input/output (I/O), memory bank 420 for one or more embodiments may comprise circuitry to support multiple bit I/O. Memory bank 420 for one or more embodiments may comprise circuitry to support multiple single master data lines or master data line pairs to provide multiple bit I/O. Memory bank 420 for one or more embodiments may comprise alternative and/or additional circuitry supporting similar access to one or more additional memory cells through one or more additional single master data lines or master data line pairs to provide multiple bit I/O. Multiple memory cells may then be common to the same activated row and selected column and therefore accessed substantially simultaneously over respective single master data lines or master data line pairs to help increase data throughput. Memory bank 420 for one or more embodiments may comprise circuitry to access multiple memory cells common to the same activated row and selected column serially over a single master data line.

Although described in connection with activating multiple memory cell rows to access memory bank 420, circuitry 400 for one or more embodiments may support one or more additional modes of access to memory bank 420. As one example, control circuitry 402 for one or more embodiments may control row decoding circuitry 412 to activate only one memory cell row for shorter burst memory accesses, for example.

For one or more embodiments where memory 210 comprises multiple memory banks, memory 210 for one or more embodiments may support activating multiple memory cell rows in one memory bank to access memory cells in that one memory bank for a single memory access. Memory 210 for one or more embodiments may support activating multiple memory cell rows across multiple memory banks to access memory cells in multiple memory banks for a single memory access.

Memory Access Using Multiple Row Activation Across Multiple Banks

Figure 5:
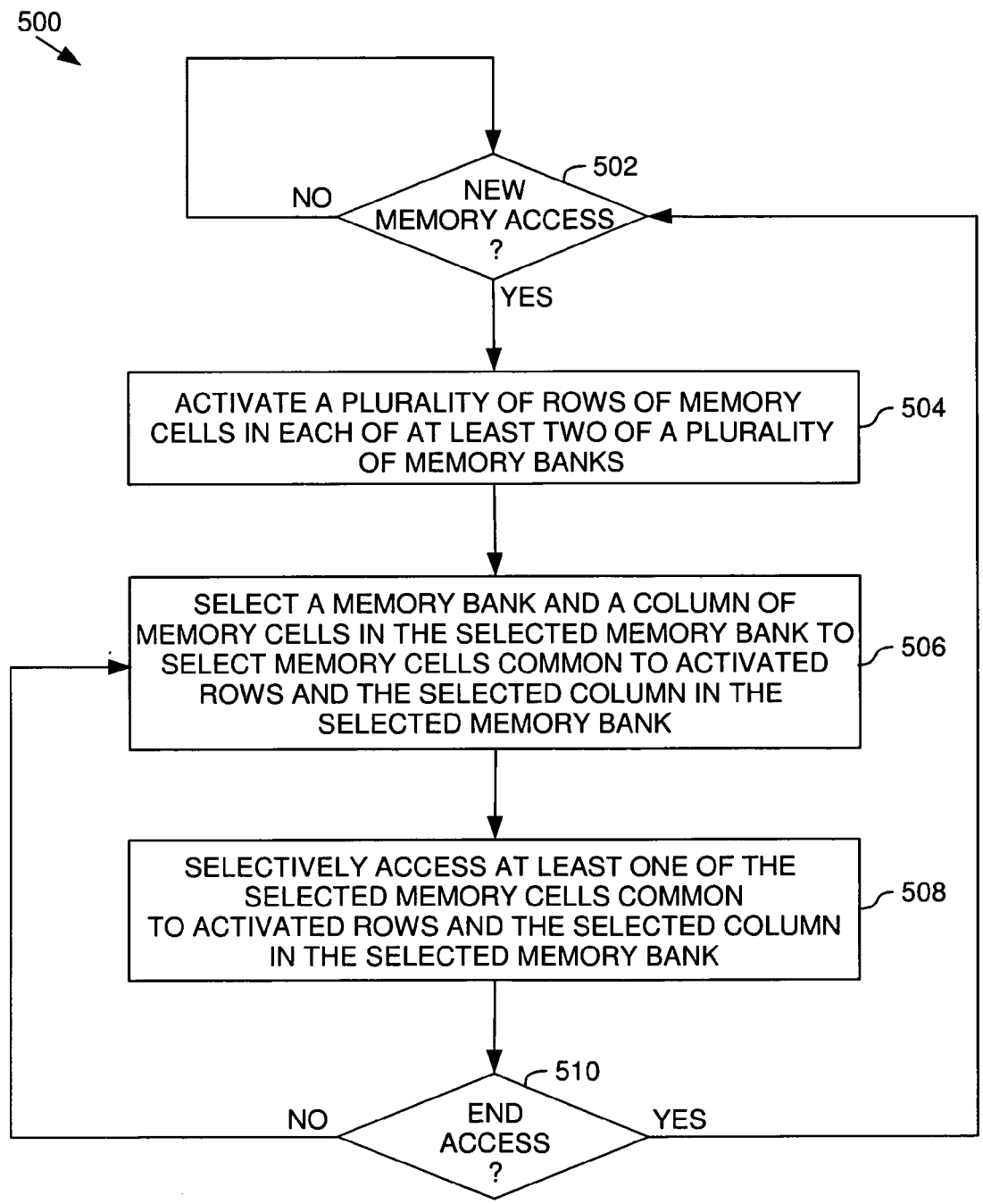
FIG. 5 illustrates, for one or more embodiments, a flow diagram for memory access using multiple activated memory cell rows across at least two memory banks.

Memory 210 for one or more embodiments may comprise circuitry to access memory cells in multiple activated rows across multiple memory banks in accordance with a flow diagram 500 of FIG. 5. Memory 210 for one or more embodiments may comprise circuitry 600 which is illustrated in FIG. 6 and which will be described in connection with flow diagram 500 of FIG. 5.

Figure 6:
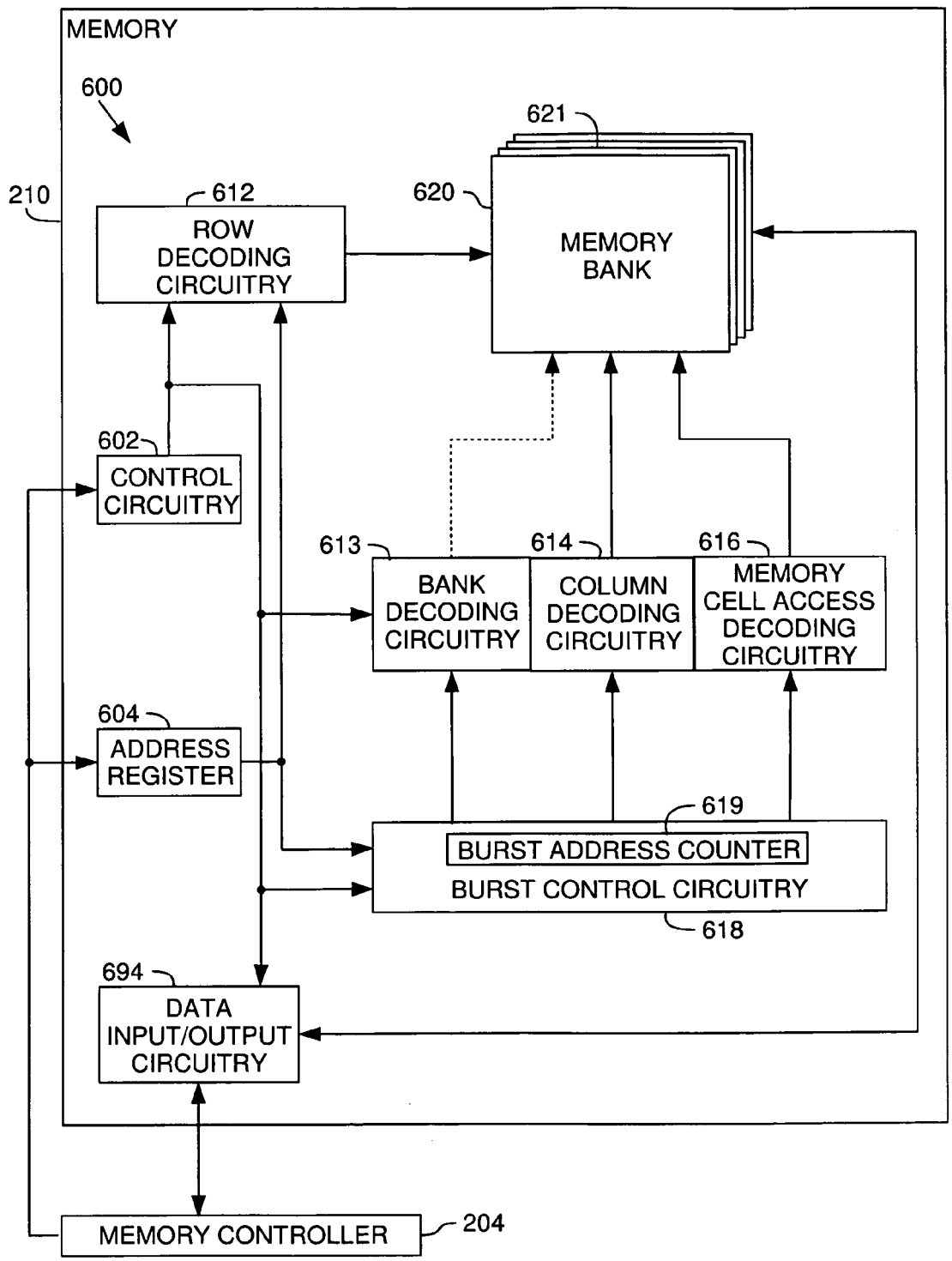
FIG. 6 illustrates, for one or more embodiments, circuitry for memory access using multiple activated memory cell rows across at least two memory banks.

For one or more embodiments for circuitry 600 of FIG. 6, control circuitry 602, address register 604, row decoding circuitry 612, column decoding circuitry 614, memory cell access decoding circuitry 616, burst control circuitry 618, memory bank 620, and data I/O circuitry 694 may function similarly as control circuitry 402, address register 404, row decoding circuitry 412, column decoding circuitry 414, memory cell access decoding circuitry 416, burst control circuitry 418, memory bank 420, and data I/O circuitry 494 of FIG. 4.

For block 502 of FIG. 5, memory 210 is to initiate a new memory access. A new memory access may be initiated similarly as for block 302 of FIG. 3.

For block 504 of FIG. 5, memory 210 activates a plurality of rows of memory cells in each of at least two of a plurality of memory banks. Memory 210 for one or more embodiments may activate a plurality of rows of memory cells in each of at least two of a plurality of memory banks substantially simultaneously. Memory 210 may activate a plurality of rows of memory cells in a memory bank for block 504 similarly as for block 304 of FIG. 3.

Memory 210 for one or more embodiments, as illustrated in FIG. 6, may comprise a plurality of memory banks, such as memory banks 620 and 621 for example, each having a plurality of memory cells. The memory banks for one or more embodiments may each be similarly designed as memory bank 420 of FIG. 4. Row decoding circuitry 612 may decode at least a portion of an address to select a plurality of rows of memory cells for activation in each of at least two of the memory banks similarly as row decoding circuitry 412 of FIG. 4. Row decoding circuitry 612 for one or more embodiments may select which memory banks are to have a plurality of activated rows based on the address.

For block 506 of FIG. 5, memory 210 selects a memory bank and a column of memory cells in the selected memory bank to select memory cells common to activated rows and the selected column in the selected memory bank. Memory 210 for one or more embodiments may select a memory bank based on an address and may select a column of memory cells in the selected memory bank similarly as for block 306 of FIG. 3.

Memory 210 for one or more embodiments, as illustrated in FIG. 6, may comprise bank decoding circuitry 613 to decode at least a portion of an address to select one of the memory banks. Bank decoding circuitry 613 may be coupled to control circuitry 602, address register 604, and the memory banks and may be controlled by control circuitry 602 to decode at least a portion of the memory address stored in address register 604 to select a memory bank containing at least one memory cell corresponding to the memory address. Bank decoding circuitry 613 may be coupled to receive at least a portion of the memory address stored in address register 604 through burst control circuitry 618 in the form of at least a portion of an initial burst address.

Column decoding circuitry 614 may decode at least a portion of an address to select a column of memory cells in the selected memory bank similarly as column decoding circuitry 414 of FIG. 4. Bank decoding circuitry 613 for one or more embodiments may select a memory bank by controlling column decoding circuitry 614 to select a column of memory cells in the selected memory bank. Bank decoding circuitry 613 for one or more other embodiments may select a memory bank by enabling the selected memory bank to have a column selected by column decoding circuitry 614 and/or to have data output from the selected memory bank.

For block 508 of FIG. 5, memory 210 selectively accesses at least one of the selected memory cells common to activated rows and the selected column in the selected memory bank. Memory 210 may selectively access at least one of the selected memory cells in the selected memory bank similarly as for block 308 of FIG. 3.

Memory cell access decoding circuitry 616 may decode at least a portion of an address to select at least one of the selected memory cells in the selected memory bank similarly as memory cell access decoding circuitry 416 of FIG. 4.

If memory 210 for block 510 of FIG. 5 is to continue accessing memory cells for the memory access initiated for block 502, memory 210 repeats operations for blocks 506 and 508 to access one or more additional memory cells in one or more activated rows of a selected memory bank. Memory 210 may repeat operations for blocks 506 and 508 to access any suitable number of any suitable one or more memory cells in any suitable one or more activated rows of any suitable memory bank in any suitable order.

Burst control circuitry 618 may control the selection of a memory bank, the selection of a column of memory cells in the selected memory bank, and the selective access to at least one of the selected memory cells in the selected memory bank in repeating operations for blocks 506 and 508. Burst control circuitry 618 for one or more embodiments may be coupled to control circuitry 602, address register 604, bank decoding circuitry 613, column decoding circuitry 614, and memory cell access decoding circuitry 616 and may be controlled by control circuitry 602 to maintain a burst address and to output at least a portion of the burst address to bank decoding circuitry 613, column decoding circuitry 614, and memory cell access decoding circuitry 616 to select a memory bank and a column of memory cells in the selected memory bank for block 506 and to select at least one of the selected memory cells for block 508.

Burst control circuitry 618 may receive at least a portion of the memory address stored in address register 604 as an initial burst address and then modify the burst address to repeat operations for blocks 506 and 508. Burst control circuitry 618 may modify and output the burst address to control bank decoding circuitry 613 to select another memory bank, to control column decoding circuitry 614 to select another column of memory cells, and/or to control memory cell access decoding circuitry 616 to select one or more memory cells from one or more other activated rows. Burst control circuitry 618 for one or more embodiments may comprise a burst address counter 619 to modify and maintain the burst address.

Burst control circuitry 618 may modify the burst address in any suitable manner to access memory cells of one or more activated rows of one or more selected memory banks in any suitable order in repeating operations for blocks 506 and 508.

Memory 210 repeats operations for blocks 506 and 508 until memory 210 for block 510 of FIG. 5 is to end accessing memory cells for the memory access initiated for block 502. Memory 210 may repeat operations for blocks 506 and 508 until memory 210 is to end accessing memory cells for the memory access similarly as for block 310 of FIG. 3.

Conclusion

Embodiments of the invention generally providing memory access using multiple activated memory cell rows to help increase data throughput by increasing the number of memory cells available for a burst access have therefore been described. While the foregoing is directed to such embodiments, other and further embodiments of the invention may be devised without departing from the basic scope thereof, and the scope thereof is determined by the claims that follow.

What is claimed is:

1. A method for providing burst access to memory comprising:
    activating a plurality of rows of memory cells in a memory bank;
    selecting a column of memory cells in the memory bank to select memory cells common to activated rows and the selected column;
    selectively accessing at least one of the selected memory cells common to activated rows and the selected column; and
    repeating the selecting and the selectively accessing to access memory cells common to activated rows and a plurality of selected columns.

2. The method of claim 1, wherein the activating comprises selecting the plurality of rows of memory cells for activation based on an address.

3. The method of claim 1, wherein the selecting comprises selecting a column of memory cells based on a burst address; and
    wherein the repeating the selecting comprises modifying the burst address to select another column of memory cells.

4. The method of claim 1, wherein the selectively accessing comprises selecting at least one of the selected memory cells based on a burst address; and
    wherein the repeating the selectively accessing comprises modifying the burst address to select at least one of the selected memory cells based on the modified burst address.

5. The method of claim 1, comprising:
    activating a plurality of rows of memory cells in each of at least two of a plurality of memory banks;
    selecting a memory bank and a column of memory cells in the selected memory bank to select memory cells common to activated rows and the selected column in the selected memory bank;
    selectively accessing at least one of the selected memory cells common to activated rows and the selected column in the selected memory bank; and
    repeating the selecting and the selectively accessing to access memory cells common to activated rows and at least one selected column in each of at least two selected memory banks.

6. The method of claim 5, wherein the selecting a memory bank comprises selecting a memory bank based on a burst address; and
    wherein the repeating the selecting a memory bank comprises modifying the burst address to select another memory bank.

7. The method of claim 1, wherein the selecting comprises selecting a column of memory cells to couple sense amplifiers coupled to memory cells common to activated rows and the selected column to first data lines, and
    wherein the selectively accessing comprises coupling one or more select first data lines to one or more second data lines to access at least one memory cell coupled to the select first data line(s).

8. The method of claim 1, wherein the selectively accessing comprises writing data to at least two memory cells in a selected column and in different activated rows.

9. An apparatus comprising:
    a memory bank having a plurality of memory cells;
    circuitry to activate a plurality of rows of memory cells in the memory bank;
    circuitry to select a column of memory cells in the memory bank to select memory cells common to activated rows and the selected column;
    circuitry to access selectively at least one of the selected memory cells common to activated rows and the selected column; and
    burst control circuitry to control the selection of a column of memory cells and the selective access to at least one of the selected memory cells common to activated rows and a selected column to access memory cells common to activated rows and a plurality of selected columns.

10. The apparatus of claim 9, wherein the circuitry to activate a plurality of rows of memory cells in the memory bank comprises row decoding circuitry to decode at least a portion of an address to select the plurality of rows of memory cells for activation.

11. The apparatus of claim 9, wherein the circuitry to select a column of memory cells in the memory bank comprises column decoding circuitry to decode at least a portion of a burst address to select the column.

12. The apparatus of claim 9, wherein the circuitry to access selectively at least one of the selected memory cells comprises decoding circuitry to decode at least a portion of a burst address to select the at least one of the selected memory cells.

13. The apparatus of claim 9, wherein the burst control circuitry comprises a burst address counter.

14. The apparatus of claim 9, comprising:
    one or more other memory banks each having a plurality of memory cells; and
    circuitry to select a memory bank to access memory cells in the selected memory bank.

15. The apparatus of claim 14, wherein the circuitry to select a memory bank comprises decoding circuitry to decode at least a portion of a burst address to select the memory bank.

16. The apparatus of claim 9, wherein the circuitry to select a column of memory cells in the memory bank comprises switches to couple sense amplifiers coupled to memory cells to first data lines selectively, and wherein the circuitry to access selectively at least one of the selected memory cells comprises switches to couple one or more first data lines to one or more second data lines selectively.

17. The apparatus of claim 9, wherein the circuitry to access selectively at least one of the selected memory cells comprises circuitry to write data to at least two memory cells in a selected column and in different activated rows.

18. A system comprising:
one or more processors;
a memory controller;
memory comprising one or more memory banks each having a plurality of memory cells;
circuitry to activate a plurality of rows of memory cells in each of one or more of the memory banks;
circuitry to select a memory bank, to select a column of memory cells in the selected memory bank to select memory cells common to activated rows and the selected column, and to access selectively at least one of the selected memory cells common to activated rows and the selected column; and
burst control circuitry to control the selection of a memory bank, the selection of a column of memory cells, and the selective access to at least one of the selected memory cells common to activated rows and a selected column to access memory cells common to activated rows and a plurality of selected columns in each of at least one selected memory bank.

19. The system of claim 18, wherein the circuitry to activate a plurality of rows of memory cells decodes at least a portion of an address from the memory controller to select the plurality of rows of memory cells for activation.

20. The system of claim 18, wherein the burst control circuitry comprises a burst address counter to maintain a burst address to select a memory bank, a column of memory cells, and at least one of the selected memory cells for access.

* * * * *